(12) United States Patent
Chen et al.

(10) Patent No.: US 6,472,861 B2
(45) Date of Patent: Oct. 29, 2002

(54) PEAK DETECTOR

(75) Inventors: Chi-MIng Chen; Pi-Fen Chen, both of Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/861,776

(22) Filed: May 21, 2001

(65) Prior Publication Data

US 2002/0008505 A1 Jan. 24, 2002

(30) Foreign Application Priority Data

Jun. 7, 2000 (TW) ....................... 89111022 A

(51) Int. Cl.[7] ............................................. G01R 19/00
(52) U.S. Cl. ................... 324/103 P; 324/158.1
(58) Field of Search ..................... 324/158.1, 103 P, 324/102, 127, 129; 340/658; 328/151, 115

(56) References Cited

U.S. PATENT DOCUMENTS 4,315,220 A * 2/1982 Findeisen ............... 324/103 P
4,373,140 A * 2/1983 Chin ....................... 324/103 P
4,620,444 A * 11/1986 Young ..................... 324/103 P
4,692,692 A * 9/1987 Prelhiere ................ 324/103 P

* cited by examiner

Primary Examiner—Michael Sherry
Assistant Examiner—Jimmy Nguyen
(74) Attorney, Agent, or Firm—J.C. Patents

(57) ABSTRACT

A peak detector comprising of a comparator, an input-trigger device, a gate-width control block, an AND gate, a first current source, a second current source, a first switch, a second switch and a capacitor. The peak detector of this invention uses simple circuits to obtain low frequency energy attenuation. The low frequency attenuation can be programmed and hence able to find the actual average voltage peak. In addition, the simple design makes the peak detector of this invention a suitable replacement candidate for the complicated analogue-to-digital converter conventionally used for detecting average energy attenuation after passing through an electric cable. The peak detector can also be used to measure voltage attenuation for signals passing through LAN, transmission medium such as cable or twisted pair or other related products.

3 Claims, 3 Drawing Sheets

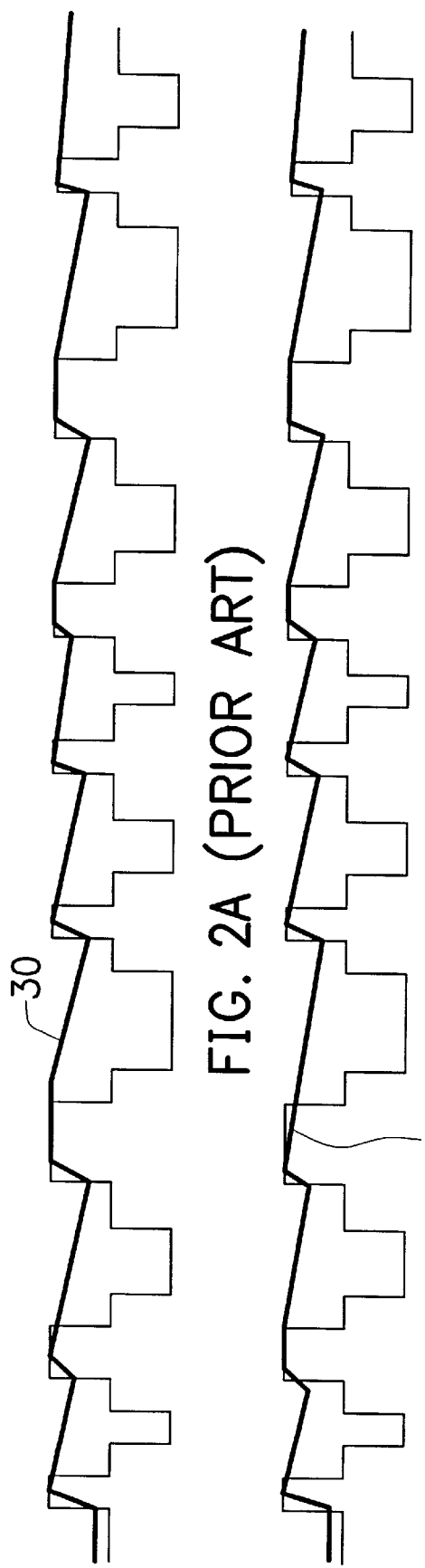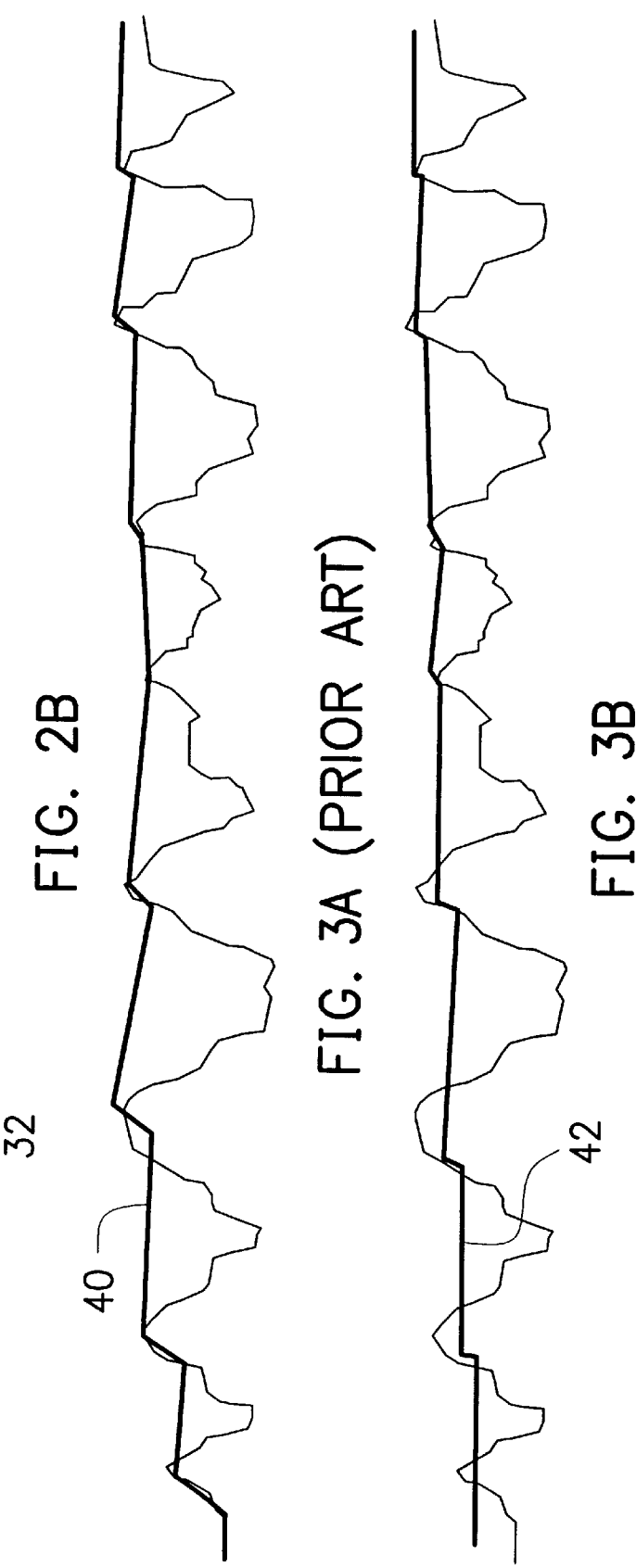

PEAK DETECTOR

CROSS-REFERENCE TO RELATED APPLICATION

This application claims the priority benefit of Taiwan application serial no. 89111022, filed Jun. 7, 2000.

BACKGROUND OF THE INVENTION

1. Field of Invention

The present invention relates to a signal detector. More particularly, the present invention relates to a peak detector having input signal triggering control and low frequency energy attenuation capability.

2. Description of Related Art

A peak detector is a device capable of measuring the peak value of a voltage signal. However, most peak detectors have no special faculties for distinguishing between high and low frequency signals. In real applications, the capacity of a peak detector to find the degree of signal attenuation in a local area network (LAN) or transmission medium such as cable or twisted pair is very important.

FIG. 1 is a circuit diagram of a conventional peak detector. As shown in FIG. 1, the conventional peak detector 10 comprises of a comparator 12, an NMOS transistor 14, a resistor 16, a capacitor 18 and a current source 20. The positive input terminal of comparator 12 is a terminal for receiving an input signal. The negative input terminal of comparator 12 is connected to a node point N1. The output terminal of comparator 12 is connected to the gate terminal of NMOS transistor 14. The source terminal of NMOS transistor 14 is connected to the output terminal of current source 20. The drain terminal of NMOS transistor 14 is connected to node point N1. One end of resistor 16 is connected to node point N1 while the other end of resistor 16 is connected to ground GND. One end of capacitor 18 is connected to node point N1 while the other end of capacitor 18 is again connected to ground GND. The input terminal of current source 20 is connected to a voltage source VCC.

FIG. 2A is a diagram showing an example signal waveform as measured by a conventional peak detector. FIG. 3A is a diagram showing the signal waveform shown in FIG. 2A after signal attenuation.

For example, when the peak detector 10 shown in FIG. 1 is used to detect voltage peak, the detected signal before attenuation has a waveform 30 shown in FIG. 2A. Since the peak detector 10 is incapable of distinguishing between low and high frequencies, output waveform 40 is still quite rugged even after attenuation as shown in FIG. 3A. In other words, if low frequency signals are not attenuated, signal waveform measured by the peak detector is bound to contain larger ripples.

In addition, several conventional techniques related to the design of peak detectors can be found in the following U.S. Patents.

(1) John D. Young et. al, in "High Speed Gated Peak Detector", U.S. Pat. No. 4,6620,444.
(2) Robert H. Leonowich et. al, in "Master-Slave Peak Detector", U.S. Pat. No. 5,254,881.
(3) Stan Dendinger et. al, in "Closed-Loop Peak Detector Topology", U.S. Pat. No. 5,428,307.

SUMMARY OF THE INVENTION

Accordingly, one object of the present invention is to provide a peak detector. The peak detector comprises of a comparator, an input-trigger device, a gate-width control block, an AND gate, a first current source, a second current source, a first switch, a second switch and a capacitor. The positive terminal of the comparator is used for receiving an input signal. The input terminal of the input-trigger device receives the output signal of the comparator. The input terminal of the gate-width control block is connected to the output terminal of the input-trigger device. One input terminal of the AND gate is connected to the output terminal of the comparator while the other input terminal of the AND gate is connected to one of the output terminals of the gate-width control block. The input terminal of the first current source is connected to a voltage source. The output terminal of the second current source is connected to a ground voltage. The ends of the first switch are connected to the output terminal of the first current source and the negative input terminal of the comparator respectively. Opening or closing of the first switch is controlled by the signal potential at the output terminal of the AND gate. The ends of the second switch are connected to the input terminal of the second current source and the negative terminal input terminal of the comparator respectively. Opening or closing of the second switch is controlled by the signal potential at the other output terminal of the gate-width control block. One end of the capacitor is connected to the negative input terminal of the comparator while the other end of the capacitor is connected to the ground voltage.

The peak detector of this invention uses simple circuits to obtain low frequency energy attenuation. Since the low frequency attenuation can also be programmed, the peak detector is able to find the actual average voltage peak. In addition, since the peak detector has a relatively simple design, the invention can replace the complicated analogue-to-digital converter conventionally used in detecting average energy attenuation after passing through an electric cable. The peak detector can also be used to measure voltage attenuation for signals passing through LAN, transmission medium such as cable or twisted pair or other related products.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 2A is a diagram showing an example signal waveform as measured by a conventional peak detector;

FIG. 2B is a diagram showing an example signal waveform as measured by a peak detector designed according to this invention;

FIG. 3A is a diagram showing the signal waveform shown in FIG. 2A after signal attenuation;

FIG. 3B is a diagram showing the signal waveform shown in FIG. 2B after signal attenuation.

DESCRIPTION OF THE PREFERRED EMBODIMENTS

Figure 1:
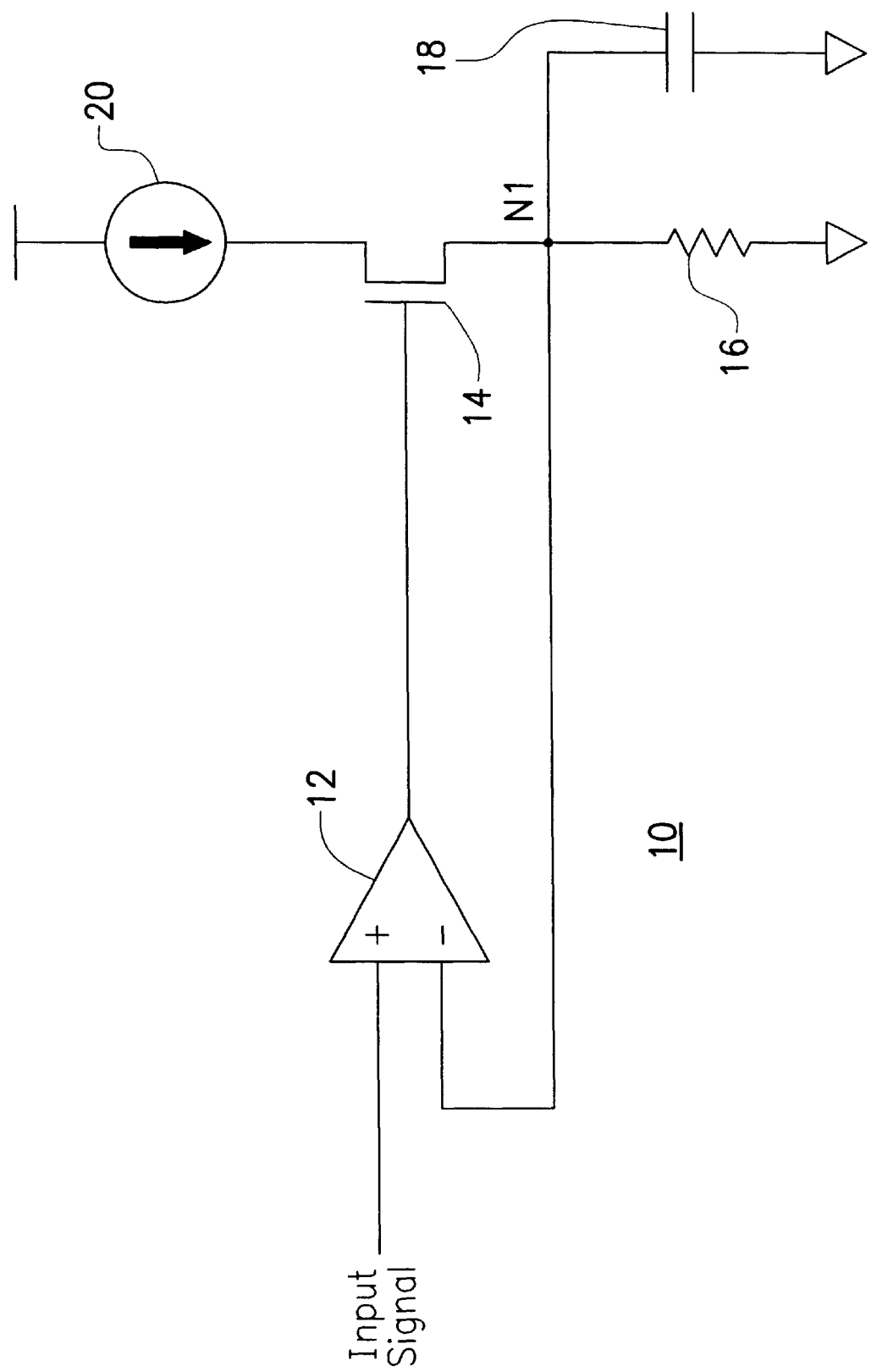
FIG. 1 is a circuit diagram of a conventional peak detector.

Reference will now be made in detail to the present preferred embodiments of the invention, examples of which are illustrated in the accompanying drawings. Wherever possible, the same reference numbers are used in the drawings and the description to refer to the same or like parts.

Figure 4:
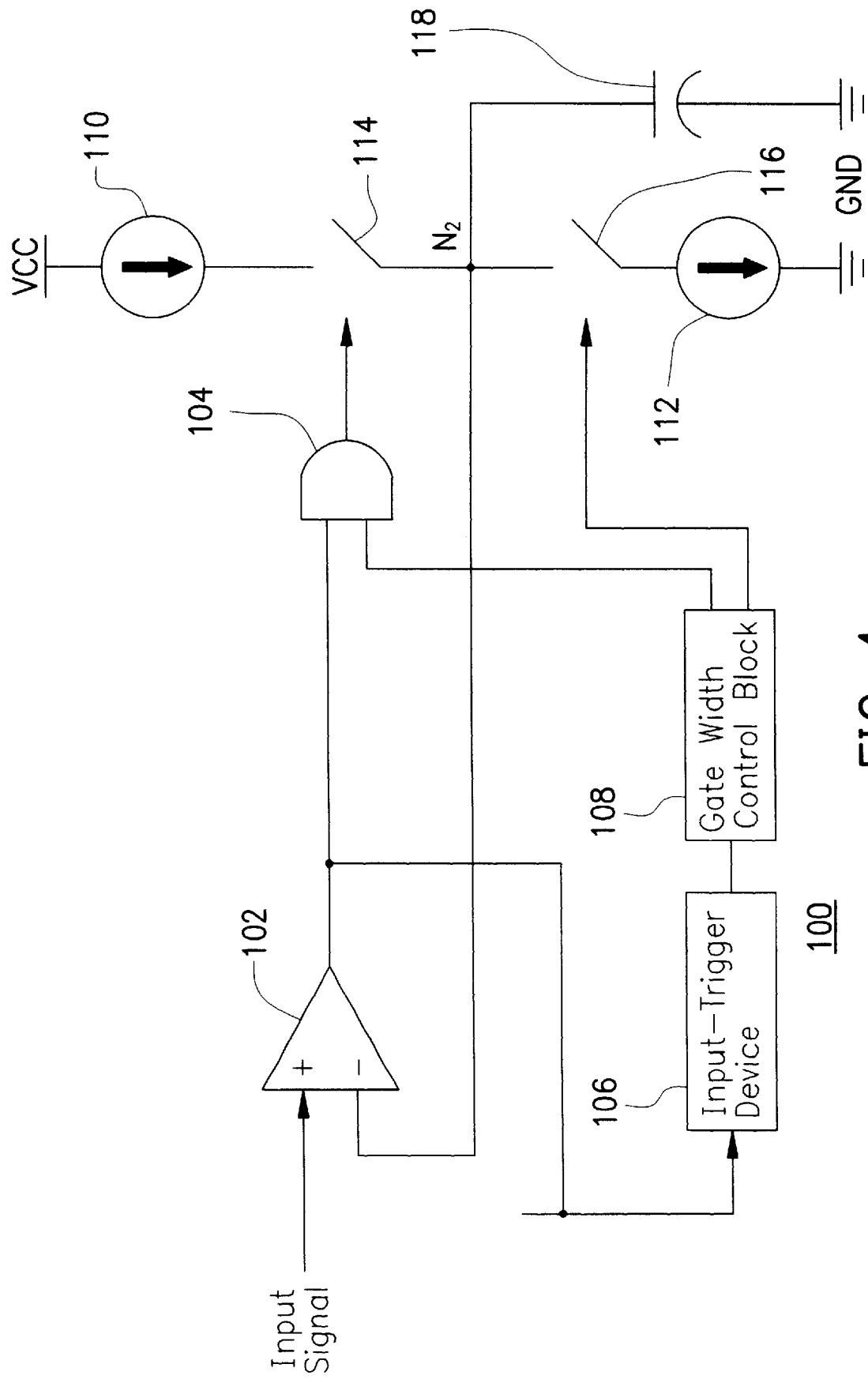
FIG. 4 is a diagram showing the circuit layout design of a peak detector according to one preferred embodiment of this invention.

FIG. 4 is a diagram showing the circuit layout design of a peak detector according to one preferred embodiment of this invention.

As shown in FIG. 4, the peak detector 100 comprises of a comparator 102, an AND gate 104, an input-trigger device 106, a gate-width control block 108, a first current source 110, a second current source 112, a first switch 114, a second switch 116 and a capacitor 118. The positive terminal of the comparator 102 is used for receiving an input signal. The negative input terminal of comparator 102 is connected to a node point N2. The output terminal of comparator 102 is connected to one of the input terminals of AND gate 104. The other input terminal of AND gate 104 is connected to the output terminal of gate-width control block 108. The input terminal of the input-trigger device 106 receives the output signal of the comparator 102. The output terminal of input-trigger device 106 is connected to the input terminal of gate-width control block 108. The input terminal of first current source 110 is connected to a voltage source VCC. The output terminal of second current source 112 is connected to a ground GND. The ends of first switch 114 are connected to the output terminal of first current source 110 and the node point N2 respectively. Opening or closing of first switch 114 is controlled by the signal potential at the output terminal of AND gate 104 and the output of AND gate is proportional to input signal trigger number. The ends of second switch 116 are connected to the input terminal of second current source 112 and the node point N2 respectively. Opening or closing of second switch 116 is controlled by the signal potential at the other output terminal of gate-width control block 108. One end of capacitor 118 is connected to the node point N2 while the other end of capacitor 118 is connected to the ground GND. The switches 114 and 116 can be NMOS transistors, for example.

FIG. 2B is a diagram showing an example signal waveform as measured by a peak detector designed according to this invention. FIG. 3B is a diagram showing the signal waveform shown in FIG. 2B after signal attenuation.

For example, when the peak detector 100 shown in FIG. 4 is used to detect voltage peak, the detected signal before attenuation has a waveform 32 shown in FIG. 2B. Note that peak detector 100 of this invention has input signal triggering control capability in addition to the capacity to control charge/discharge ratio. By controlling opening and closing of switches 114 and 116 through gate width control block 108, charging or discharging of capacitor 118 is under control. Hence, the peak detector can effectively distinguish high frequency from low frequency. Moreover, the low frequency portion can be attenuated at the same time because the number of crossing in the low frequency portion is far lower that in the high frequency portion. Therefore, the monitored signal has a smooth waveform 42 (due to the gate-width control block) as shown in FIG. 3B.

In other words, peak detector 100 of this invention has low frequency attenuation capability. The attenuation not only can be carried out through a relatively simple circuit, the degree of attenuation is programmable too by blocking the gate width control block 108. The invention is suitable for an attenuation (A) that is proportional to $$\sqrt{\frac{1}{f}}$$

(f is the frequency) such as channel attenuation so that the actual average voltage peak can be found.

The peak detector of this invention uses simple circuits to distinguish the average energy attenuation of signals passing through a cable. Since the peak detector has a relatively simple design, the invention can replace the complicated analogue-to-digital converter conventionally used in detecting average energy attenuation after passing through an electric cable. In addition, the peak detector can also be used to measure voltage attenuation for signals passing through LAN, transmission medium such as cable or twisted pair or other related products.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A peak detector, comprising:
   a comparator having a positive input terminal for receiving an input signal;
   an input-trigger device having an input terminal for receiving an output signal of the comparator;
   a gate-width control block having an input terminal connected to the output terminal of the input-trigger device;
   an AND gate having a first input terminal connected to the output terminal of the comparator and a second input terminal connected to the output terminal of the gate-width control block;
   a first current source having an input terminal connected to a voltage source;
   a second current source having an output terminal connected to a ground voltage;
   a first switch having one end connected to the output terminal of the first current source and the other end connected to the negative input terminal of the comparator with the first switch controlled by the signal potential at the output terminal of the AND gate;
   a second switch having one end connected to the input terminal of the second current source and the other end connected to the negative input terminal of the comparator with the second switch controlled by the signal potential at the output terminal of the gate-width control block; and
   a capacitor having one end connected to the negative input terminal of the comparator and the other end connected to ground voltage.

2. The peak detector of claim 1, wherein the first switch includes an NMOS transistor.

3. The peak detector of claim 1, wherein the second switch includes an NMOS transistor.

* * * * *